(12) United States Patent
Paganin

(10) Patent No.: US 8,871,174 B2
(45) Date of Patent: Oct. 28, 2014

(54) METHOD FOR THE SUPPLY OF FLUORINE

(75) Inventor: Maurizio Paganin, Brussels (BE)

(73) Assignee: Solvay SA, Brussels (BE)

( * ) Notice: Subject to any disclaimer, the term of this patent is extended or adjusted under 35 U.S.C. 154(b) by 0 days.

(21) Appl. No.: 13/636,595

(22) PCT Filed: Mar. 22, 2011

(86) PCT No.: PCT/EP2011/054338
§ 371 (c)(1),
(2), (4) Date: Sep. 21, 2012

(87) PCT Pub. No.: WO2011/117234
PCT Pub. Date: Sep. 29, 2011

(65) Prior Publication Data
US 2013/0012027 A1    Jan. 10, 2013

(30) Foreign Application Priority Data
Mar. 26, 2010 (EP) ..................................... 10157904

(51) Int. Cl.
*C01B 7/00* (2006.01)
*C01B 7/20* (2006.01)
*C23C 16/44* (2006.01)
*C25B 15/02* (2006.01)
*C25B 1/24* (2006.01)

(52) U.S. Cl.
CPC . *C25B 1/245* (2013.01); *C01B 7/20* (2013.01); *C23C 16/4405* (2013.01); *C25B 15/02* (2013.01); *Y02E 60/321* (2013.01)
USPC .......................................... 423/462; 423/500

(58) Field of Classification Search
None
See application file for complete search history.

(56) References Cited

U.S. PATENT DOCUMENTS

| | | | |
|---|---|---|---|
| 4,711,680 A * | 12/1987 | Christe | ...................... 149/109.4 |
| 6,602,433 B1 | 8/2003 | Bhardwaj et al. | |
| 6,926,871 B1 | 8/2005 | Bhardwaj et al. | |
| 2002/0156321 A1 * | 10/2002 | Syvret | .......................... 562/849 |
| 2006/0130929 A1 | 6/2006 | Hodgson et al. | |
| 2006/0174944 A1 | 8/2006 | Olander et al. | |
| 2009/0068844 A1 | 3/2009 | Pischtiak et al. | |

FOREIGN PATENT DOCUMENTS

| | | |
|---|---|---|
| WO | WO 03046244 A2 | 6/2003 |
| WO | WO 2004009873 A1 | 1/2004 |
| WO | WO 2006043125 A1 | 4/2006 |
| WO | WO 2011/032983 A2 | 3/2011 |
| WO | WO 2012004194 A1 | 1/2012 |
| WO | WO 2012004195 A1 | 1/2012 |
| WO | WO 2012016997 A1 | 2/2012 |
| WO | WO 2012034825 A2 | 3/2012 |
| WO | WO 2012034978 A1 | 3/2012 |

* cited by examiner

*Primary Examiner* — Duy Deo

(57) ABSTRACT

Elemental fluorine is used as etching agent for the manufacture of electronic devices, especially semiconductor devices, micro-electromechanical devices, thin film transistors, flat panel displays and solar panels, and as chamber cleaning agent mainly for plasma-enhanced vapor deposition (PECVD) apparatus. For this purpose, fluorine often is produced on-site. The invention provides a process wherein the contamination of the elemental fluorine with gaseous impurities, such as air or moisture, is prevented by producing it on site and delivering it to the point of use under a pressure higher than ambient pressure.

15 Claims, No Drawings

METHOD FOR THE SUPPLY OF FLUORINE

CROSS-REFERENCE TO RELATED APPLICATIONS

This application is a U.S. national stage entry under 35 U.S.C. 371 of International Application No. PCT/EP2011/054338 filed Mar. 22, 2011, which claims priority to European application No. 10157904.3, filed Mar. 26, 2010, the whole content of this application being incorporated herein by reference for all purposes.

The invention concerns a method for the supply (delivery) of elemental fluorine under elevated pressure in a method for the manufacture of electronic devices. Elemental fluorine ($F_2$) has no GWP and no impact on the ozone layer and is often produced electrolytically from HF. In the presence of an electrolyte salt, HF releases fluorine if a voltage of at least 2.9 V is applied. Practically, the voltage is often kept in a range of 8 to 10 or 11 Volt.

A molten HF adduct of KF, often having the formula KF·(1.8–2.3)HF, is the preferred electrolyte salt. HF is fed into the reactor containing the molten electrolyte salt, and $F_2$ is electrolytically formed from the HF according to the equation (1) by applying a voltage and passing electric current through the molten salt:

$$2HF \rightarrow H_2 + F_2 \qquad (1)$$

Elemental fluorine is useful as fluorinating agent, e.g. for the manufacture of polymers which are fluorinated on the surface, for the manufacture of fluorinated solvents especially for Li ion batteries, as chamber cleaning agent and etchant for the manufacture of electronic devices, especially semiconductors, photovoltaic cells, micro-electromechanical systems ("MEMS"), TFTs (thin film transistors for flat panel displays or liquid crystal displays), and the like.

As to the use as etchant for the manufacture of electronic devices, especially semiconductors, photovoltaic cells, MEMS and TFTs, several consecutive steps of deposition of layers and etching a part of them are necessary. Fluorine can be used for etching of layers constituted of very different constitution, for example, for etching silicon containing layers or other layers of compounds which form volatile reaction products, e.g. tungsten. Etching can be performed thermally or plasma-assisted.

As to the use for chamber cleaning, usually, during deposition processes performed in treatment chambers—often CVD chambers (chambers wherein layers are deposited on items via chemical vapor deposition, e.g. plasma-enhanced CVD, metal organic CVD or low pressure CVD)—undesired deposits form on the walls and on inner constructive parts of the chamber and must be regularly removed. This is achieved by treating the deposits thermally or plasma-enhanced with elemental fluorine as chamber cleaning agent.

Especially for the use of elemental fluorine as an etchant, but also when used as chamber cleaning agent, it is desirable that the elemental fluorine be very pure. The intrusion of water, carbon dioxide, nitrogen and oxygen is considered as undesired.

After the fluorine is manufactured by the electrolytic manufacture (or any other method), it can be stored in pressurized cylinders and transported to the site of use. In plants with higher $F_2$ demand, it is preferred to produce the $F_2$ directly on site.

Thus, U.S. Pat. No. 6,602,433 discloses an apparatus for treating a substrate, the apparatus comprising a chamber, a support for a substrate, and a delivery system for delivering an etchant and/or deposition gas into the chamber wherein the delivery system is positioned locally to the chamber. The gas generator operates at or near atmospheric pressure. In U.S. Pat. No. 6,926,871, the same patentee states that the generator operates from several torr to atmospheric pressure.

WO 2003/046244 discloses the generation, distribution and use of $F_2$ within a fabrication facility. According to one embodiment, $F_2$ is produced at a pressure of 8 mbar in the electrolytic cells and stored at 15 psig (about 1.03 bar abs or 103 kPa); the pressure at delivery is not indicated. According to another embodiment, $F_2$ is stored in a negative pressure bulk storage tank, delivered under a negative pressure to individual tool compressors, compressed therein and delivered to the tools.

WO 2004/009873 discloses an apparatus and a method for fluorine production. The fluorine is produced by electrolysis from HF in a fluorine generating cassette. The fluorine may be used in the manufacture of electronic devices, e.g. in the production of TFTs. Produced fluorine can be stored in holding tanks safely withstanding 5 bar pressure of fluorine although such pressures are not generally employed with fluorine in the interests of safety.

WO 2006/043125 discloses a fluorine gas generator disposed in the gas feed system of a semiconductor plant. The apparatus described contains a flow management section which is connected to a buffer tank, to a gas storage section that has a plurality of gas sources that store various active and inert gases, and to a gas generating system comprising a cathode compartment and an anode compartment which generates $F_2$. The pressure in the buffer tank is set, for example, to 0.18 MPa above atmospheric pressure (i.e. to about 2.8 Bara) while the pressure in the gas generating system (the electrolytic cell) is between atmospheric pressure and 820 torr (approximately 109 kPa) No data are given as to the pressure of gases delivered to the semiconductor tool.

US 2006/0130929 discloses a method of supplying $F_2$ to a processing system wherein an on-site $F_2$ generator supplies high purity $F_2$ to the processing system. A transportable gas storage vessel can be applied with $F_2$ stored at typically less than 35 psig (2.4 bar abs or 240 kPa). A fixed storage tank is operated at a pressure of 5 to 25 psig (0.34 to 1.7 bar abs or 34 kPa to 170 kPa). The delivery pressure is not indicated.

Object of the present invention is to provide an improved process for delivery of fluorine to processes wherein it is desirable to use pure fluorine.

The invention concerns a method for the manufacture of electronic devices, especially semiconductors, photovoltaic cells, MEMS, or TFTs, comprising etching of items in a chamber or cleaning a chamber using elemental fluorine as etching agent or chamber cleaning agent comprising at least a step of manufacture of the elemental fluorine, a step of delivery of the fluorine to the point of use, and optionally at least one further step selected from the group consisting of a step of purification and a step of storage, wherein the elemental fluorine is kept at least in the step of delivery to the point of use under a pressure which is greater than ambient pressure.

The chamber is generally a chamber wherein electronic devices are etched, or which is to be cleaned from time to time or according to a schedule to remove undesired deposits.

Thus, at least the step of delivery of the fluorine to the point of use is performed under a pressure which is greater than ambient pressure. It is especially preferred that the method of the present invention further comprises at least one step selected from the group consisting of purification and storage, and that the elemental fluorine is kept at least in the steps of delivery to the point of use and in at least one of the steps of purification and storage under a pressure which is above ambient pressure. In another preferred embodiment, the method comprises at least one step of each of purification, storage and delivery and is kept in all three steps under a pressure which is higher than ambient pressure. The word "a", e.g. in an expression like "a step", is not intended to limit the expression to a single step. The term "comprising" includes the meaning "consisting of". Advantage of maintaining the fluorine under a pressure which is above ambient pressure at least during the step of delivery to the point of use, and especially during the steps of purification, storage and delivery is that no air, nitrogen, oxygen, carbon dioxide, moisture and other impurities can intrude into the fluorine and thus, contaminate it.

In one embodiment which concerns the manufacture of $F_2$ by the electrolysis of HF in the presence of KF as electrolyte, the $F_2$ is kept under pressure even in the electrolytic cells. Preferably, the $F_2$ is kept under pressure right from the start of its generation by electrolysis in electrolytic cells, during purification, delivery to the point of use and, if performed, during its storage.

The content of oxygen is below 750 ppm by volume and often even below 300 ppm by volume and remains at that low level. Due to the elevated pressure, the level of oxygen, but also of oxygen containing impurities, nitrogen and carbon dioxide remains very low. The content of nitrogen is in the range of only some hundreds of ppmv, and even lower, and remains at that low level during delivery. The content of carbon dioxide, for example, is often equal to or lower than 10 ppmv and remains during delivery at that low level. The content of water is often equal to or lower than 1 ppmv, and remains at that low level during delivery. Thus, the process of the invention allows to maintain a low level of gases, e.g. of oxygen, nitrogen, water and carbon dioxide, prevents the intrusion of these compounds from the gas atmosphere surrounding the means of delivery such as pipes, valves, manifolds etc., and thus allows to maintain the low level of such gases.

In the following, the delivery is explained in more detail.

The generation of $F_2$ can be performed in one or several electrolytic cells. If one electrolytic cell is applied, this cell may deliver $F_2$ to one or more tools. If $F_2$ is generated by means of two or more electrolytic cells, the $F_2$ generated in one cell may be delivered to one or more tools separately from the $F_2$ generated in other cells which may be delivered to another tool or other tools. Alternatively, the $F_2$ generated in the two or more cells can be passed into a common line and distributed to the tools where it is applied. This embodiment is preferred because most often, the $F_2$ generated will be purified before being used, and it is of course technically more advantageous to pass the $F_2$ in a common line through a respective purification apparatus, and not to pass the $F_2$ generated through a multitude of parallel arranged purification apparatuses.

Often, the process is performed using an apparatus with several electrolytic cells; the $F_2$ produced is fed from the individual cells into a common $F_2$ line. In view of this preferred embodiment, the invention will be explained in detail.

It is advantageous to provide valves which can isolate a specific electrolytic cell or a group of electrolytic cells from others in case a shutdown of respective cells for repair or maintenance is necessary.

The $F_2$ produced is then delivered via the common line to a means to purify it. In this step of purification, solids and/or HF may be removed.

The step or steps of purification can be performed before or after storage (if a step of storage is foreseen). If desired, the fluorine can be purified before and after storage; in this case, preferably both purification steps are performed under a pressure which is higher than ambient pressure. The purification can be performed in a manner principally known. For example, entrained solids which are mainly composed of solidified electrolyte salt (adduct of HF and KF in varying composition) can be removed in a frit made from $F_2$-resistant material, especially Monel metal or nickel. Alternatively or additionally, solids can be removed by contacting the $F_2$ with liquid HF, e.g. in a jet scrubber. Entrained HF can be removed by passing the fluorine through NaF. Alternatively or additionally, HF can be removed in a cooled trap, e.g. a trap cooled to equal to or lower than about −60° C., e.g. to a temperature in the range from −60° C. to −80° C. The purification means can be redundant so that a part of the means can be regenerated while other means operate. Valves are useful also here to shut off individual means from the $F_2$ produced.

After the step or steps of purification, the treated $F_2$ can be delivered via a line to the tool. If the $F_2$ is intended to be delivered to several tools, a distribution system may be applied. In this distribution system, desirable quantities of $F_2$ can be delivered to the respective tools. If desired, the $F_2$ can be mixed with other suitable gases, e.g. noble gases like Ar or Xe before being introduced into the tool.

If desired, the $F_2$ is passed after the purification to a storage tank where it is preferably kept under the pressure mentioned above.

The process of the invention may be supported by other commonly used components, e.g. regulator valves, seal pots, pressure transducers, thermo couples, filters or a valve control system.

The tools may be process chambers applied for the manufacture of semiconductors, a chamber for producing MEMS, a chamber for the manufacture of TFTs or flat panel displays. The tool may for example be a chemical or physical vapor deposition chamber. Often, the tool includes a plasma generator.

In a preferred embodiment, the fluorine is pressurized by means of compressors, and no pressurizing gas is applied, unless elemental fluorine.

The pressure of the fluorine is preferably equal to or greater than 1.5 bar abs. (150 kPa abs.). The pressure is preferably equal to or lower than 15 bar abs. (1500 kPa abs.), more preferably, equal to or lower than 12 bar abs. (1200 kPa abs). The preferred range is from 2 to 3 bar abs. (200 to 300 kPa abs.). Preferably, the pressure of the fluorine is maintained within the indicated upper levels and lower levels during purification and delivery and, if performed, also during storage. Especially preferably, the pressure of the fluorine is maintained within the indicated upper levels and lower levels, notably from 2 to 3 bar abs, during its electrolytic generation, during its purification and during its delivery to the point of use and, if performed, also during its storage. The advantage is that a risk of contamination by air or moisture is further reduced, and that no compressor is needed.

The step of the manufacture of elemental fluorine is preferably performed as described above by the electrolysis of HF using the adduct of KF and HF as an electrolyte salt; alternatively, it can be split off from a metal fluoride with high valency. For example, $MnF_4$ can be heated to split off $F_2$ forming $MnF_x$ wherein x is approximately 3.

The step of purification, if foreseen, comprises for example a step of distillation in which especially HF can be removed; instead or additionally, the fluorine can be contacted with NaF to remove HF.

The step of storage, if foreseen, preferably denotes the storage of the elemental fluorine in suitable tanks, e.g. stainless steel bottles.

The step of delivery preferably denotes passing the fluorine from the manufacturing apparatus to the point of use through pipes.

The method of the present invention allows for the delivery of elemental fluorine to the point of use with a content of carbon dioxide, nitrogen and oxygen which is not higher than the carbon dioxide, nitrogen and oxygen content immediately after the manufacture.

In the apparatus used to generate and deliver $F_2$, double isolation valves having a vacuum connection in between improve safety.

The advantage of the process of the present invention is that $F_2$ produced keeps its degree of purity when delivered to the point of use. Thus, once the $F_2$ produced was purified as given above, it may be delivered to the point of use. After its delivery, no additional step or steps for purification of the delivered $F_2$ is or are necessary. Consequently, a preferred embodiment of the present process is characterized in that no step or steps of purification, respectively, are performed to purify $F_2$ after its delivery to the point of use. Especially preferably, no step or steps of purification of the $F_2$ to remove nitrogen, oxygen, air, humidity or carbon dioxide are performed after the delivery of the $F_2$ to the point of use. It has to be noted that humidity ($H_2O$) is expected to react with $F_2$ under the formation of $OF_2$ and HF. Thus, the term "humidity" includes the reaction products of $H_2O$ with $F_2$, especially HF and $OF_2$; since they are not formed, they must not be removed.

The method of the invention is especially suitable for the on-site production of fluorine. In an on-site production, the fluorine is manufactured on a site and, directly delivered, if desired, without any storage step, to the point of use on the same site. Preferably, the point of use is a plant wherein the elemental fluorine is used as thermal or plasma-assisted etching agent in the manufacture of semiconductors, MEMS, solar cells and TFTs (flat panel displays), or for thermal or plasma-assisted cleaning of treatment chambers used in the manufacture of semiconductors, MEMS, solar cells and TFTs, (flat panel displays), or both for said manufacture and chamber cleaning. The plasma is local plasma produced directly in the etching chamber, or remote plasma produced in a separate chamber with a plasma source.

Thus, preferably, the elemental fluorine is produced and delivered on-site for use in the manufacture of semiconductors, MEMS, solar cells and TFTs. More preferably, the elemental fluorine is produced by electrolysis of HF in the presence of an adduct of KF and HF, purified and delivered on-site under a pressure of 2 to 3 bar (abs.) into an etching chamber as etchant in the manufacture of semiconductors, MEMS, solar cells and TFTs, or as a chamber cleaning agent into a thermal or plasma-assisted etching chamber used for the manufacture of semiconductors, MEMS, solar cells and TFTs, especially when the chamber is a plasma etching chamber. Especially preferably, even during its electrolytic generation, the $F_2$ is under said pressure.

The fluorine can be manufactured, if desired, in a fluorine generating cassette as described in WO 2004/009873. If desired, each cassette can be allocated to one or more process chambers wherein etching is performed; or a plurality of fluorine generating cassettes is connected to a fluorine gas distribution system which is connected to the chambers.

The fluorine is preferably generated on site of its point of use via electrolysis in an apparatus which is in fluid communication with the process chamber or process chambers, especially preferably via a purification unit comprising means for removal of solids, e.g. a frit as described above, and/or a canister or tower comprising an adsorbent for HF or a cooled separator for HF separation. If desired, the fluorine generator is located near the process chamber as the point of use, e.g. the distance can be 500 m or less, and is often sometimes 50 m or less, and can be in close proximity to the process chamber, e.g. in a distance of 10 m or less. Thus, preferably, the generated elemental fluorine is not filled into a tank or into pressurized bottles, which are then disconnected from the delivery line. If desired, the fluorine is stored in tanks or bottles only which remain connected to the delivery line. The process can be performed, for example, in a plant according to the skid concept as described in U.S. provisionals 61/383,533 filed Sep. 15, 2010, and 61/383,204 filed Sep. 16, 2010. The plant described therein provides fluorine gas to a tool which applies fluorine gas as reactant to perform chemistry in this tool which apparatus comprises skid mounted modules including at least one skid mounted module selected from the group consisting of a skid mounted module comprising at least one storage tank for HF, denoted as skid 1, a skid mounted module comprising at least one electrolytic cell to produce $F_2$, denoted as skid 2, a skid mounted module comprising purification means for purifying $F_2$, denoted as skid 3, a skid mounted module comprising means to deliver fluorine gas to the point of use, denoted as skid 4, a skid mounted module comprising cooling water circuits, denoted as skid 5, a skid mounted module comprising means to treat waste gas, denoted as skid 6, a skid mounted module comprising means for the analysis of $F_2$, denoted as skid 7, and a skid mounted module comprising means to operate the electrolysis cells, denoted as skid 8.

The advantage of skids is, for example, that they are manufactured, piped, wired and assembled together before shop testing. It is preferred if they are constructed such that the interfaces between the skids are minimized and that all parts in the respective skid are accessible as easily as possible for maintenance, inspection or repair.

The method of the invention allows providing elemental fluorine to be produced and delivered, especially when applied on-site, without the danger of intrusion of air, i.e. oxygen, nitrogen, carbon dioxide and humidity and respective contamination of the $F_2$.

Should the disclosure of any patents, patent applications, and publications which are incorporated herein by reference conflict with the description of the present application to the extent that it may render a term unclear, the present description shall take precedence.

The following examples is intended to explain the invention in detail without limiting it.

EXAMPLE 1

Delivery of Elemental Fluorine On-Site

1. Manufacture of Elemental Fluorine:

KF.2HF is filled into an electrolysis cell, heated to about 80-120° C. and molten therein. HF is fed into the electrolysis cell, voltage in the range of 8 to 12 V is applied, and current is passed through the composition of HF and the molten electrolyte salt which is kept in a temperature range between 80 and 100° C. Elemental fluorine and elemental hydrogen form in the respective electrode compartments. The elemental fluorine is passed through a Monel metal frit to remove solids, compressed in a compressor to a pressure of about 2.5 bar abs. (about 250 kPa) and passed through a bed of NaF to remove HF.

2. Delivery of Pressurized Fluorine

The compressed fluorine is passed under said pressure in a pipe directly to a facility located on-site. In this facility, the elemental fluorine is applied for the cleaning of a plasma chamber from silicon-containing residues deposited during the PECVD (plasma-enhanced vapor deposition) layers in a process for the manufacture of semiconductors.

Since the fluorine is kept under a pressure above ambient pressure from the manufacturing apparatus to the facility where it is applied, no air contaminates the fluorine, and the low level of oxygen, oxygen containing impurities, nitrogen and carbon dioxide remains essentially the same.

EXAMPLE 2

Production and Delivery of Elemental Fluorine Under Pressure

1. Manufacture of Elemental Fluorine

KF.2HF is filled into an electrolysis cell, heated to about 80-120° C. and molten therein. HF is fed into the electrolysis cell, voltage in the range of 8 to 12 V is applied, and current is passed through the composition of HF and the molten electrolyte salt which is kept in a temperature range between 80 and 100° C. Elemental fluorine and elemental hydrogen form in the respective electrode compartments. The $F_2$ is kept in the cell under a pressure of approximately 2.5 bar abs (about 250 kPa). It is passed through a Monel metal frit and contacted in a jet scrubber with liquid HF kept at a temperature of about −80° C. to remove solids (mainly entrained solidified electrolyte salt with the approximate composition KF.2HF), and passed through a trap cooled to −80° C. and then through a bed of NaF to remove HF.

2. Delivery of Fluorine

The $F_2$ is passed under said pressure of about 2.5 bar abs in a pipe directly to a facility located on-site. In this facility, the $F_2$ is applied for the cleaning of a plasma chamber from silicon-containing residues deposited during the PECVD (plasma-enhanced vapor deposition) layers in a process for the manufacture of semiconductors.

Since the fluorine is kept under a pressure above ambient pressure from the manufacturing apparatus to the facility where it is applied, no air contaminates the fluorine, and the low level of oxygen, oxygen containing impurities, nitrogen and carbon dioxide remains essentially the same during the step of delivery.

The invention claimed is:

1. A method for the manufacture of electronic devices comprising etching of items in a chamber or for cleaning a chamber using elemental fluorine as etching agent or chamber cleaning agent, said method comprising:

at least a step of manufacture of elemental fluorine, and at least one step of purification, at least one step of storage, and at least one step of delivery of the elemental fluorine to a point of use, wherein the elemental fluorine is kept in the steps of purification, storage, and delivery under a pressure which is greater than ambient pressure.

2. The method of claim 1 being for the manufacture of electronic devices selected from the group consisting of semiconductors, photovoltaic cells, micro-electromechanical systems, and thin film transistors.

3. The method of claim 1, wherein the elemental fluorine is kept under a pressure which is greater than ambient pressure in the step of electrolytic generation.

4. The method of claim 1, wherein the elemental fluorine is kept at a pressure of about 2 to 3 bar (abs.).

5. The method of claim 1, wherein the elemental fluorine is produced by electrolysis of HF in the presence of an adduct of KF and HF as electrolyte salt, or by thermally splitting off fluorine from high valency metal fluorides.

6. The method of claim 1, wherein the elemental fluorine is produced on-site of its point of use.

7. The method of claim 1, wherein the elemental fluorine is produced and delivered on-site for use in the manufacture of semiconductors, micro-electromechanical systems, solar cells and thin film transistors.

8. The method of claim 1, wherein the elemental fluorine is produced by electrolysis of HF in the presence of an adduct of KF and HF as electrolyte salt, purified and delivered on-site under a pressure of from 2 to 3 bars absolute into an etching chamber as etchant in the manufacture of semiconductors, micro-electromechanical systems, solar cells, and thin film transistors.

9. The method of claim 1, wherein the elemental fluorine is produced by electrolysis of HF in the presence of an adduct of KF and HF as electrolyte salt, purified and delivered on-site under a pressure of from 2 to 3 bars absolute as chamber cleaning agent into a thermal or plasma-assisted etching chamber used for the manufacture of semiconductors, micro-electromechanical systems, solar cells and thin film transistors.

10. The method of claim 9, wherein the etching chamber is a plasma etching chamber.

11. The method of claim 1 wherein the elemental fluorine is manufactured by electrolysis in a fluorine generator which is in fluid communication with the chamber.

12. The method of claim 11 wherein the fluorine generator is located in proximity of the chamber.

13. The method of claim 1 wherein the oxygen content is below 750 ppm by volume.

14. The method of claim 1 wherein the content of carbon dioxide is equal to or lower than 10 ppm by volume.

15. The method of claim 1 wherein an apparatus having double isolation valves having a vacuum connection in between is used to generate and to deliver $F_2$ in the steps of its manufacture and of its delivery.

* * * * *